US010372566B2

(12) United States Patent
Kawamura et al.

(10) Patent No.: US 10,372,566 B2
(45) Date of Patent: Aug. 6, 2019

(54) STORING MEMORY ARRAY OPERATIONAL INFORMATION IN NONVOLATILE SUBARRAYS

(71) Applicant: Micron Technology, Inc., Boise, ID (US)

(72) Inventors: Christopher John Kawamura, Boise, ID (US); Scott James Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 15/267,817

(22) Filed: Sep. 16, 2016

(65) Prior Publication Data

US 2018/0081774 A1  Mar. 22, 2018

(51) Int. Cl.
*G06F 11/00* (2006.01)
*G06F 11/20* (2006.01)
*G11C 11/22* (2006.01)
*G06F 11/10* (2006.01)
*G11C 29/52* (2006.01)

(52) U.S. Cl.
CPC ........ *G06F 11/2094* (2013.01); *G11C 11/221* (2013.01); *G11C 11/2255* (2013.01); *G11C 11/2257* (2013.01); *G11C 11/2273* (2013.01); *G11C 11/2275* (2013.01); *G06F 11/1068* (2013.01); *G06F 2201/805* (2013.01); *G11C 29/52* (2013.01)

(58) Field of Classification Search
CPC .......................... G06F 11/2094; G06F 11/1068
See application file for complete search history.

(56) References Cited

U.S. PATENT DOCUMENTS

| 5,490,264 | A  | * | 2/1996 | Wells ................. G11C 29/88 711/100 |
| 7,032,158 | B2 |   | 4/2006 | Alvarez et al. |
| 8,239,732 | B2 |   | 8/2012 | Tan et al. |
| 8,756,375 | B2 |   | 6/2014 | Flynn |
| 9,514,838 | B2 |   | 12/2016 | Porterfield |

(Continued)

OTHER PUBLICATIONS

ISA/KR, International Search Report and Written Opinion of the International Searching Authority, Int'l. Appl. No. PCT/US2017/048906, dated Dec. 8, 2017, Korean Intellectual Property Office, Seo-gu, Daejeon, Republic of Korea, 18 pgs.

*Primary Examiner* — Bryce P Bonzo
*Assistant Examiner* — Katherine Lin
(74) *Attorney, Agent, or Firm* — Holland & Hart LLP

(57) ABSTRACT

Methods, systems, and apparatuses for storing operational information related to operation of a non-volatile array are described. For example, the operational information may be stored in a in a subarray of a memory array for use in analyzing errors in the operation of memory array. In some examples, an array driver may be located between a command decoder and a memory array. The array driver may receive a signal pattern used to execute an access instruction for accessing non-volatile memory cells of a memory array and may access the first set of non-volatile memory cells according to the signal pattern. The array driver may also store the access instruction (e.g., the binary representation of the access instruction) at a non-volatile subarray of the memory array.

25 Claims, 9 Drawing Sheets

(56) References Cited

U.S. PATENT DOCUMENTS

| | | | |
|---|---|---|---|
| 9,684,686 B1* | 6/2017 | Morley | G06F 17/30312 |
| 9,748,001 B2 | 8/2017 | Li et al. | |
| 2002/0083003 A1* | 6/2002 | Halliday | G06Q 30/04 |
| | | | 705/52 |
| 2007/0079086 A1* | 4/2007 | Wang | G06F 3/0625 |
| | | | 711/161 |
| 2007/0250659 A1* | 10/2007 | Booth | G11C 16/32 |
| | | | 711/103 |
| 2009/0231903 A1* | 9/2009 | Ogiwara | G11C 29/50 |
| | | | 365/145 |
| 2012/0079223 A1* | 3/2012 | Jaquette | G06F 11/2094 |
| | | | 711/162 |
| 2016/0350178 A1* | 12/2016 | Lien | G06F 11/1048 |
| 2017/0110206 A1* | 4/2017 | Ryu | G11C 29/44 |
| 2017/0140807 A1* | 5/2017 | Sun | G11C 11/2275 |
| 2018/0060194 A1* | 3/2018 | Ryu | G06F 3/0604 |

* cited by examiner

STORING MEMORY ARRAY OPERATIONAL INFORMATION IN NONVOLATILE SUBARRAYS

BACKGROUND

The following relates generally to memory devices and more specifically to storing memory array operational information in non-volatile subarrays.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Memory arrays may fail due to conditions created by a user of the array, but the cause of the failure (i.e., the user-created condition) may be unknown during subsequent troubleshooting. So troubleshooting failed memory arrays or components of memory devices may involve to extensive iteration and testing of a failed part in an effort to recreate, identify, and capture (e.g., using a logic analyzer) the cause of the failure.

BRIEF DESCRIPTION OF THE DRAWINGS

The disclosure herein refers to and includes the following figures.

DETAILED DESCRIPTION

Figure 1:
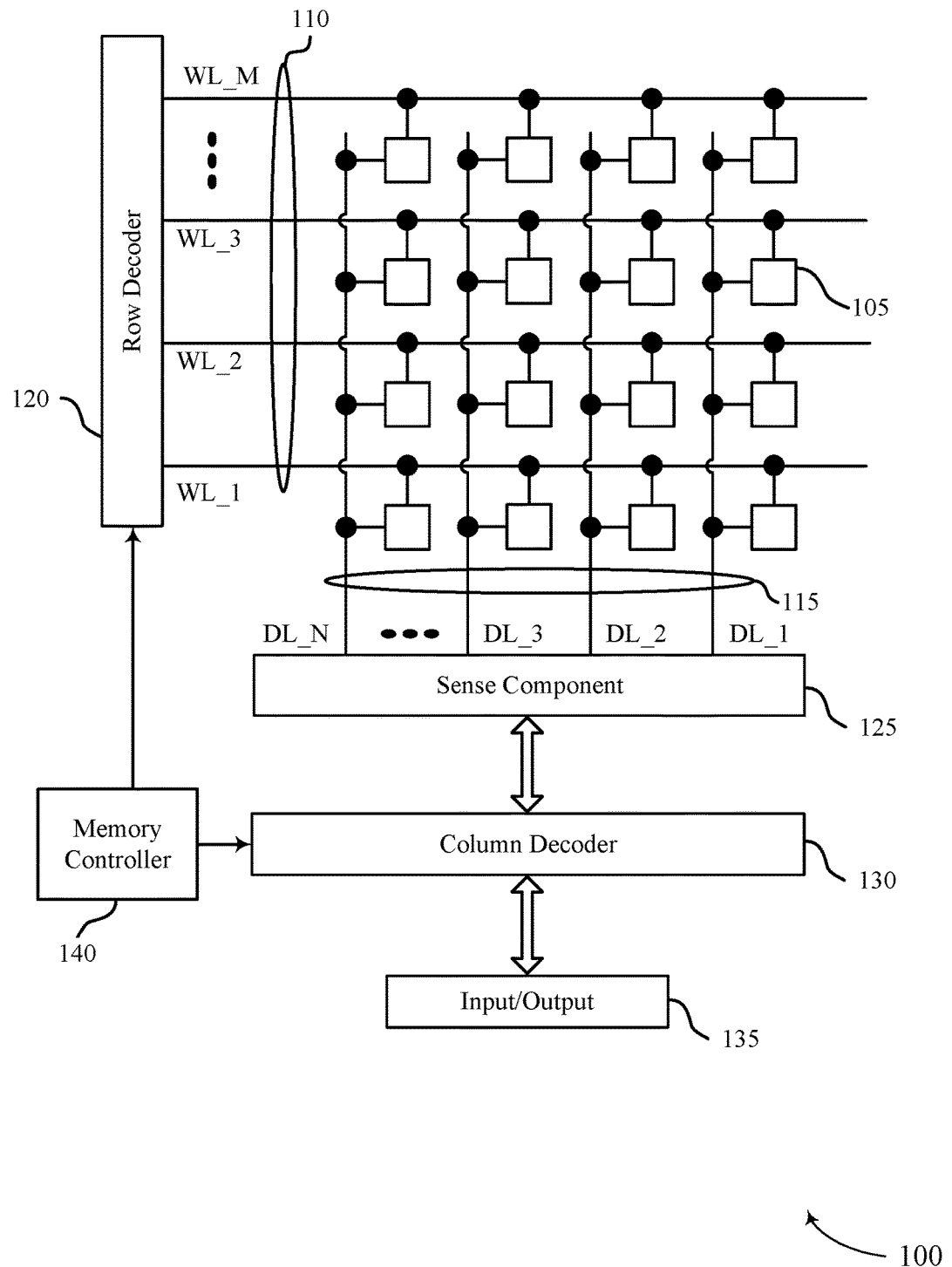
FIG. 1 illustrates an exemplary memory array that supports storing operational information in non-volatile subarrays in accordance with various embodiments of the present disclosure.

Operational information for a memory array may be stored in a non-volatile memory array to facilitate subsequent analysis of the array's performance following the operations, including failures due to the operations. Operational information may include access instruction or other instructions applied to the memory array, a temperature of the memory array, a number of cycles performed by the memory array, or the like. Oftentimes, when a memory array fails, the failure is due to a user-created scenario or environment, and the user may be unable to identify the cause of the error or may return the memory array to the manufacturer with little detail as to what caused the failure. For example, this may be due to the user running large-scale procedures that prevent the user from pin-pointing the cause of the failure. So the stored operational information may be retrieved following a failure, and the instructions, events, conditions, etc. giving rise to the failure may be recreated and evaluated.

In some examples, the operational information may be stored in a non-volatile portion of a memory array that includes volatile and non-volatile cells. By storing information in the non-volatile portion, the operational information may be retained even if power is removed from the memory array. In this way, the logic states stored in memory cells of the non-volatile portion, and corresponding to the operational information, may be preserved until it can be analyzed. For instance, the operational information may be preserved so that a manufacturer may receive a returned, defective part from a customer.

In some cases, the memory array is a non-volatile memory array itself—i.e., is composed primarily of non-volatile memory cells—and a subset of the non-volatile memory cells (or subarray) are set aside or configured for storing the operational information. Using a non-volatile memory array and a subarray of the non-volatile memory array for storing operational information may enable the use of the same access technology (e.g., the same access circuitry, instructions, signal patterns, timing, etc.) when accessing either the subarray or a memory portion of a memory array.

By way of example, the memory array may include an array driver that is between the memory cells and a command decoder. The array driver may include circuitry to determine the binary value of an instruction applied to the memory array and may manage the non-volatile subarray used for analyzing errors or operational information, which may be or include access instructions, temperature, or the like. For instance, the array driver may include a command predecoder which maps a received signal pattern for accessing the memory array to the binary form of an intended instruction. The array driver may additionally include write circuitry (e.g., amplifiers, timing circuits, etc.) to write the instruction to memory cells of the non-volatile subarray, and a counter to keep track of which memory cells of the non-volatile subarray have been written. Operational information may also include other values, information, or data related to operation of the memory array. This operational information may be stored in a non-volatile memory array and subsequently analyzed—during a trouble-shooting procedure, for instance.

In some examples, the array driver stores an instruction to the subarray each time an instruction is executed by the memory array. In other examples, the array driver stores instructions after a test mode has been enabled, which may occur for a number of reasons. For instance, a customer may encounter a repeatable failure and may manually enable the test mode and re-run the problematic code. The test mode may be entered if a number of error correction code (ECC) errors are observed or if an indication that a customer's application has failed is received. In some cases, the test mode may be entered based on determining that a repetitive instruction set is being applied to the memory array, or any combination of the above may be used. Thus, when a failed device is returned to the manufacturer, for example, the operational instructions that were executed prior to the failure may be stored at the non-volatile subarray.

In some examples, the array driver, non-volatile subarray used for storing operational information, and the command decoder may be configured to autonomously perform repetitive testing patterns across a number of non-volatile memory cells. For instance, a short instruction pattern may be stored in the non-volatile memory cells, and the array driver may provide the instruction pattern back to the command decoder in a desired order, along with a corresponding range of memory cells be accessed according to the pattern. The command decoder may then map each of the instructions received from the array driver to a signal pattern used to implement that instruction and provide the signal pattern back to the array driver, which may relay the signal pattern to the array of memory cells. A result of accessing the memory cells may be compared with an expected result. And the result of the comparison may be used to identify corrupted memory cells. This process may be repeated a number of times, and the command decoder or the array driver, via the counter, may increment an address associated with a group of memory cells each time the pattern is repeated.

Features of the disclosure introduced above are further described below in the context of a memory array. Specific examples are then described for a circuit that supports storing operational information in a non-volatile subarray. These and other features of the disclosure are further illustrated by and described with reference to apparatus diagrams, system diagrams, and flowcharts that relate to storing operational information in non-volatile subarrays.

FIG. 1 illustrates an example memory array 100 that supports storing operational information in non-volatile subarrays in accordance with various embodiments of the present disclosure. Operational information may include access instruction or other instructions applied to the memory array, a temperature of the memory array, a number of cycles performed by the memory array, or the like. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 may also be referred to as access lines and digit lines 115 may also be referred to as bit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. A sequence of read and write operations may be examples of operational information that is stored in a sub-array, as discussed below, and then analyzed following error in or failures of the array 100.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. The combination of word lines 110 and digit lines 115 accessed at a given time or in a given sequence may be an example of operational information stored in a sub-array, as discussed below, and then analyzed following error in or failures of the array 100.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as input/output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The non-volatile properties of ferroelectric memory cells 105 may support the storing of operational information in a memory array 100 that includes ferroelectric memory cells 105. For instance, a number of ferroelectric memory cells within a memory array 100 may be allocated to a subarray that is used to store operational information. The operational information may include any of: previous access instructions executed by the ferroelectric memory array, a temperature of the ferroelectric memory array 100 at a certain time, an age of the ferroelectric memory array 100, or the like. Since the ferroelectric memory cells 105 exhibit non-volatile properties, operational information may be retained without being supplied power for significantly longer periods than volatile cells, such as DRAM cells for instance. In some examples, these longer periods may be substantially long enough to account for packaging and transit time needed to return a failed memory array to the manufacturer (e.g., months, years, etc.).

In some examples, an array driver may be included in ferroelectric memory array 100. The array driver may be an intermediary device that is located between a command decoder, used to map received instructions to a corresponding access signal pattern, and the ferroelectric memory cells 105. The array driver may be used to de-map a received signal pattern to the binary value of the corresponding instruction and may also be used for accessing the subarray. For instance, the array driver may write the binary values of the instructions to the subarray and may also keep track of which ferroelectric memory cells 105 of the subarray have been written or most recently written.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
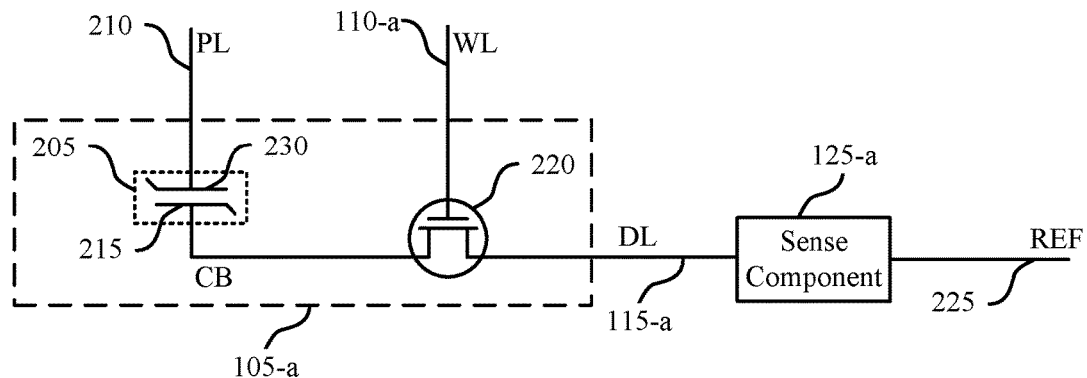
FIG. 2 illustrates an exemplary circuit that supports storing operational information in non-volatile subarrays in accordance with various embodiments of the present disclosure.

FIG. 2 illustrates an example circuit 200 that supports storing operational information in non-volatile subarrays in accordance with various embodiments of the present disclosure. As mentioned above, operational information may include access instruction or other instructions applied to the memory array, a temperature of the memory array, a number of cycles performed by the memory array, or the like. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-*a*. As described above, various states may be stored by charging or discharging capacitor 205.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate selection component 220; for example, a voltage applied to word line 110-*a* is applied to the transistor gate, connecting capacitor 205 with digit line 115-*a*.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing plate line 210 and word line 110-*a*. Biasing plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate."

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as input/output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high. In some instances, the sense component 125-*a* is "overdriven" by applying a voltage to the output that determines then drives the voltages of digit line 115-*a* and reference line 225 in opposite directions. In some cases, the voltage resulting on the digit line 115-*a* may be driven in the opposite direction as the plate voltage to apply a greater voltage across the capacitor 205. Or if the voltage at the plate line 210 is fixed, the voltage of the digit line 115-*a* may be driven either higher or lower than the plate voltage to apply a voltage across the capacitor 205.

In some examples, memory cell 105-*a* is included in a subarray of a non-volatile memory array that has been allocated to storing operational information. The subarray may be accessed using an array driver, which is located between a command decoder and the array of memory cells. In some cases, the array driver, in combination with sense component 125-*a*, may store operational information such as previously applied instructions, temperature, age, and the like to the subarray. The operational information may be accessed during later debugging operations if the memory array fails, even if power is removed from the memory array.

Figure 3:
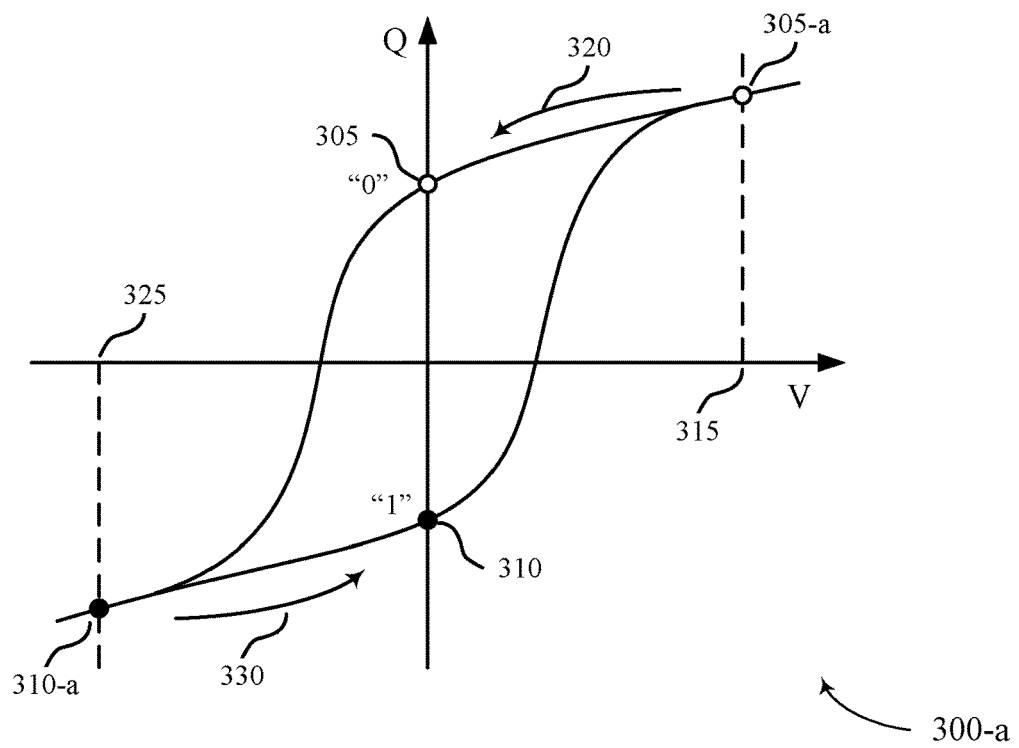
FIG. 3 illustrates example hysteresis plots for a ferroelectric memory cell that support storing operational information in non-volatile subarrays in accordance with various embodiments of the present disclosure.
Figure 3:
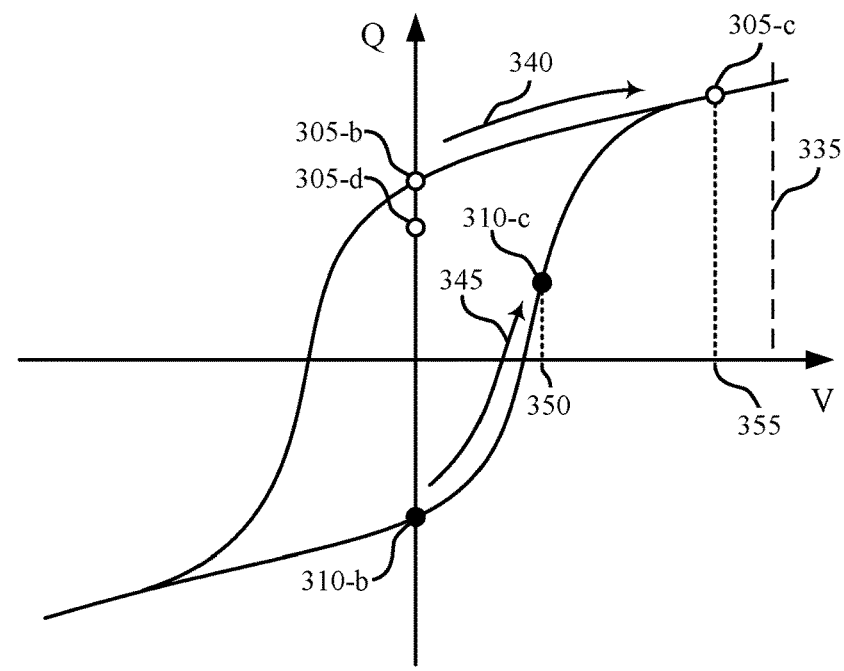

FIG. 3 illustrates an example of non-linear electrical properties with hysteresis curves 300-*a* and 300-*b* for a ferroelectric memory cell that may store operational information in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335—voltage 350) or (voltage 335—voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335—voltage 350) and (voltage 335—voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

As discussed above, a ferroelectric capacitor may store a logic state without a voltage being applied across the ferroelectric capacitor. Moreover, the ferroelectric capacitor may be capable of storing the logic state for months or years. Thus, a memory array that has stored operational information using a subarray of ferroelectric memory cells may be disconnected from a power supply, delivered to a manufacturer, and read by the manufacturer to determine the last set of instructions applied to the memory array prior to failure. The manufacturer may use this information to focus troubleshooting efforts or to at least recreate a prior failure.

Figure 4:
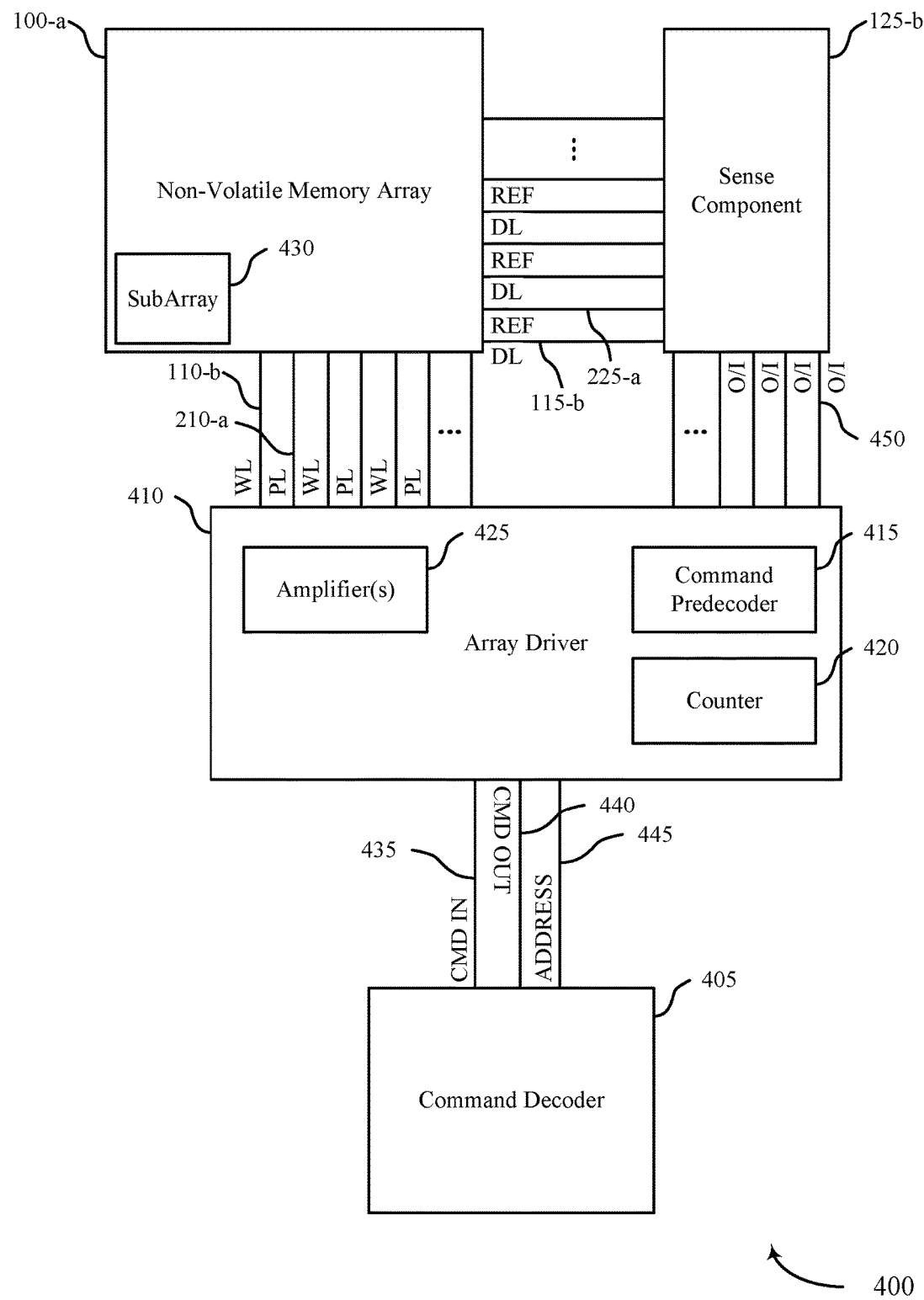
FIG. 4 illustrates an exemplary circuit that supports storing operational information in non-volatile subarrays in accordance with embodiments of the present disclosure.

FIG. 4 illustrates an example of a circuit 400 for storing operational information in non-volatile subarrays. As mentioned above, operational information may include access instruction or other instructions applied to the memory array, a temperature of the memory array, a number of cycles performed by the memory array, or the like. Circuit 400 may include a memory array 100-*a*, word lines 100-*b*, digit lines 155-*b*, and sense component 125-*b*, which may be examples of a memory array 100, word lines 110, digit lines 115, and sense component 125, as discussed with reference to FIGS. 1 and 2. Circuit 400 may also include plate line 210-*a* and reference lines 225-*a*, which may be examples of plate line 210 and reference line 225, as discussed with reference to FIG. 2. Circuit 400 may also include command decoder 405, array driver 410, command predecoder 415, counter 420, amplifiers 425, subarray 430, command input line 435, command output line 440, address lines 445, and input/output (I/O) lines 450.

Command decoder 405 may be in electronic communication with array driver 410 via command input line 435 (or a first set of command lines) and command output line 440 (or a second set of command lines). Command decoder 405 may map a received instruction (e.g., ACT, PRE, WR, etc.) to a plurality of signals used to implement that instruction. That is the command decoder may assert/de-assert control signals that are applied to memory array 100-*a* in a pattern that corresponds to the received instruction.

Array driver 410 may be in electronic communication with the word lines 110 (or a first set of access lines) of memory array 100. In some examples, array driver 410 may be located between command decoder 405 and memory array 100. Array driver 410 may be used to intercept commands from command decoder 405 and relay those commands to memory array 100-*a*. After intercepting the commands, array driver 410 may store the commands in the subarray 430. Array driver 410 may also intercept address information that accompanies the commands and store the address information in subarray 430, along with other memory array information, such as temperature, a number of performed access operations, etc. Array driver 410 may include command predecoder 415, counter 420, and a set of amplifiers 425.

Command predecoder 415 may be used to map an instruction pattern (or plurality of signals associated with an access instruction) received from command decoder 405 to a binary representation of the access instruction. Counter 420 may be used to track which non-volatile memory cells of subarray were last written. The set of amplifiers 425 may be in electronic communication with the word line 110 and a set of non-volatile memory cells included in memory array 100-*a*, and may be operable to amplify received signals (e.g., the plurality of signals received over command input line 435) to store instructions at the set of non-volatile memory cells.

Memory array 100-*a* may include a set of non-volatile memory cells. The non-volatile memory cells may be ferroelectric memory cells and may be grouped together to enable addressable access operations of multiple ferroelectric memory cells at once. Memory array 100-*a* may also include subarray 430. Subarray 430 may include a number of non-volatile memory cells used to store access instructions that are applied to memory array 100-*a*. In some cases, the number of non-volatile memory cells selected to be included in subarray 430 is predetermined (e.g., set by the manufacturer). In some cases, the number of non-volatile memory cells included in subarray 430 is dynamically configured. For instance, command decoder 405 may send an indication to array driver 410 indicating the number of non-volatile memory cells include in subarray 430, and array driver 410 may configure subarray 430 accordingly. The number of non-volatile memory cells included in subarray 430 may be determined based on an amount of information that is desired (e.g., based on a user preference, a size of a code, etc.) to be stored at subarray 430.

Sense component 125-*b* may be in electronic communication with digit lines 115-*b* (the second set of access lines) and reference lines 225-*a* of memory array 100-*a*. An output of sense component 125-*b* may be in electronic communication with array driver 410 via I/O lines 450. I/O lines 450 may be used to carry a value (e.g., a voltage) stored at a latch of sense component 125-*b* to array driver 410) or may carry a signal used to overdrive sense component 125-*b*.

The command input line 435 may be used to carry a number of signals, which correspond to and are used to execute a received instruction, to array driver 410. The set of address lines 445 may provide an address along with an instruction and may indicate which memory cells of memory array 100-*a* to access according to the instruction. The set of plate lines 210-*a* may be used, in combination with digit lines 155-*b*, to apply a voltage across a memory cell.

The command output line 440 may be used to provide instructions stored at subarray 430 back to command decoder 405. For instance, array driver 410 may pass the instructions stored at subarray 430 back to command decoder 405 so a user or application may read the stored instructions during a debugging process. In another instance, a certain pattern of instructions (e.g., ACT-WR-PRE, ACT-RD-PRE, etc.) may be stored at subarray 430. Array driver 410 may then use the command output line 440 to provide the instructions back to command decoder 405, which may reapply the instructions to array driver 410 as a corresponding signal pattern and in the order in which the instructions were received. The address corresponding to the instruction may be incremented with each re-application of the instructions. In this way, subarray 430, array driver 410, and command decoder 405 may be configured to operate as a built-in self-testing (BIST) mechanism and may autonomously test multiple cell groups without having to supply test instructions to command decoder 405 from the memory controller.

In some examples, command decoder 405 receives an access instruction (e.g., RD) or a pattern of access instructions (e.g., ACT-WR-PRE) used to execute an access operation. In some cases, a received access instruction may be received as a parallel or serial pattern of high and low signals corresponding to bit values of a binary string. Command decoder 405 may map the received pattern to a different set of high and low signals used to execute the received instruction at memory array 100-*a*. That is, based on the access instruction received at command decoder 405, command decoder 405 may activate/deactivate certain components of memory array 100-*a* by applying a plurality of access signals according to a certain timing. Command decoder 405 may output the plurality of access signals via command input line 435. Command decoder 405 may also provide an address with the plurality of access signals identifying which memory cell or range of memory cells included in memory array 100-*a* are to be accessed according to the instruction.

Array driver 410 may intercept the plurality of access signals, before the access signals are applied to memory array 100-*a*. The set of amplifiers 425 may relay the plurality of access signals to memory array 100-*a*, although in some cases, the set of amplifiers 425 may be replaced by signal traces that carry the plurality of access signals to memory array 100-*a* without amplification. Command predecoder 415 may de-map the plurality of access signals back to a binary string (e.g., the plurality of access signals for an ACT command may correspond to the binary string {0110}). In some cases, command predecoder 415 may perform the de-mapping based on a mode (e.g., a test mode) of the array driver.

After the de-mapping, array driver 410 may use a combination of the amplifiers 425, counter 420, and sense component 125-*b* to store the binary string in non-volatile memory cells of subarray 430. In some cases, counter 420 may provide an address identifying the non-volatile memory cells of subarray 430, and the set of amplifiers 425, in combination with the sense component 125-*b*, may apply a signal pattern to the appropriate word lines 100-*b*, plate lines 210-*a*, and digit lines 155-*b* to write a binary value of a received instruction in accordance with an address provided by the counter. If the memory cells include in memory array 100-*a* use non-volatile memory elements similar to or the same as the non-volatile memory cells of subarray 430, then the write operation may be performed using the same or similar signal patterns and access circuitry used to write data to memory cells of memory array 100-*a* that are not included in subarray 430.

In some cases, additional information other than a previously applied access instruction and address may be provided to array driver 410. The additional information may include, for instance, a temperature of the memory array 100-*a*, a value indicating the number of access operations performed on the memory array, data written to the memory array 100-*a*, a value associated with a duration between access operations, etc. In this way, information pertaining to a failure event of memory array 100-*a* may be stored at subarray 430 and may be preserved until a later time, even if power is cutoff. This may accommodate for a delivery time needed to ship a malfunctioning memory array 100-*a* back to a manufacturer, and the stored information may be used for subsequent operational/failure analysis operations. After writing information to subarray 430, counter 420 may be updated (e.g., incremented) to reflect a next address of subarray 430 in preparation of a subsequent access operation. In some cases, subarray 430 may be implemented as a circular buffer.

Array driver 410 may continue to de-map and store instructions at subarray 430 as access signals are received from command decoder 405, and the above process may be repeated. In some instances, array driver 410 may be configured to continually store instructions while memory array 100-*a* is operated. In other instances, array driver 410 may begin storing instructions after a certain mode of operation has been initialized. For instance, array driver 410 may refrain from storing instructions until a test mode has been activated. The test mode may be activated a number of ways, (e.g., based on the occurrence of a certain event, a user input, etc.). In some examples, array driver 410 receives an indication to begin storing access instructions at subarray 430. For instance, array driver 410 may receive a first flag received from an application that has experienced an operating failure, a second flag received from an error correction code component that has determined that a predetermined number of error correcting code (ECC) errors has occurred, a trigger to enter a test mode, or any combination thereof.

In some examples, array driver 410 and subarray 430 may be used to facilitate BIST operations. For example, subarray 430 may be configured to store an instruction pattern (e.g., ACT-WR-PRE, ACT-RD-PRE, etc.). Array driver 410 may read the instruction pattern from subarray 430 and may provide the instructions to command decoder 405. Command decoder 405 may map the instruction pattern to a corresponding set of access signals and send the access signals back to array driver 410. Array driver 410 may relay the set of access signals to memory array 100-*a*, and may additionally provide an address with the access signals so that the access instructions are applied to a desired set of memory cells of memory array 100-*a*. Counter 420 may be updated after the instruction pattern has been applied to the set of memory cells. In some cases, a result of applying the instruction pattern is compared with an expected result. For instance, in on example, an instruction pattern used to write a logic state (e.g., logic 1) to a memory cell and read the memory cell may be stored at subarray 430. This instruction pattern may be applied to a memory cell and after the read operation is performed, array driver 410, or embodiments of a memory controller, may determine whether the read logic state matches the written logic state (e.g., logic 1). This operation may be repeated until the instruction pattern has been applied to a desired range of memory cells.

Figure 5:
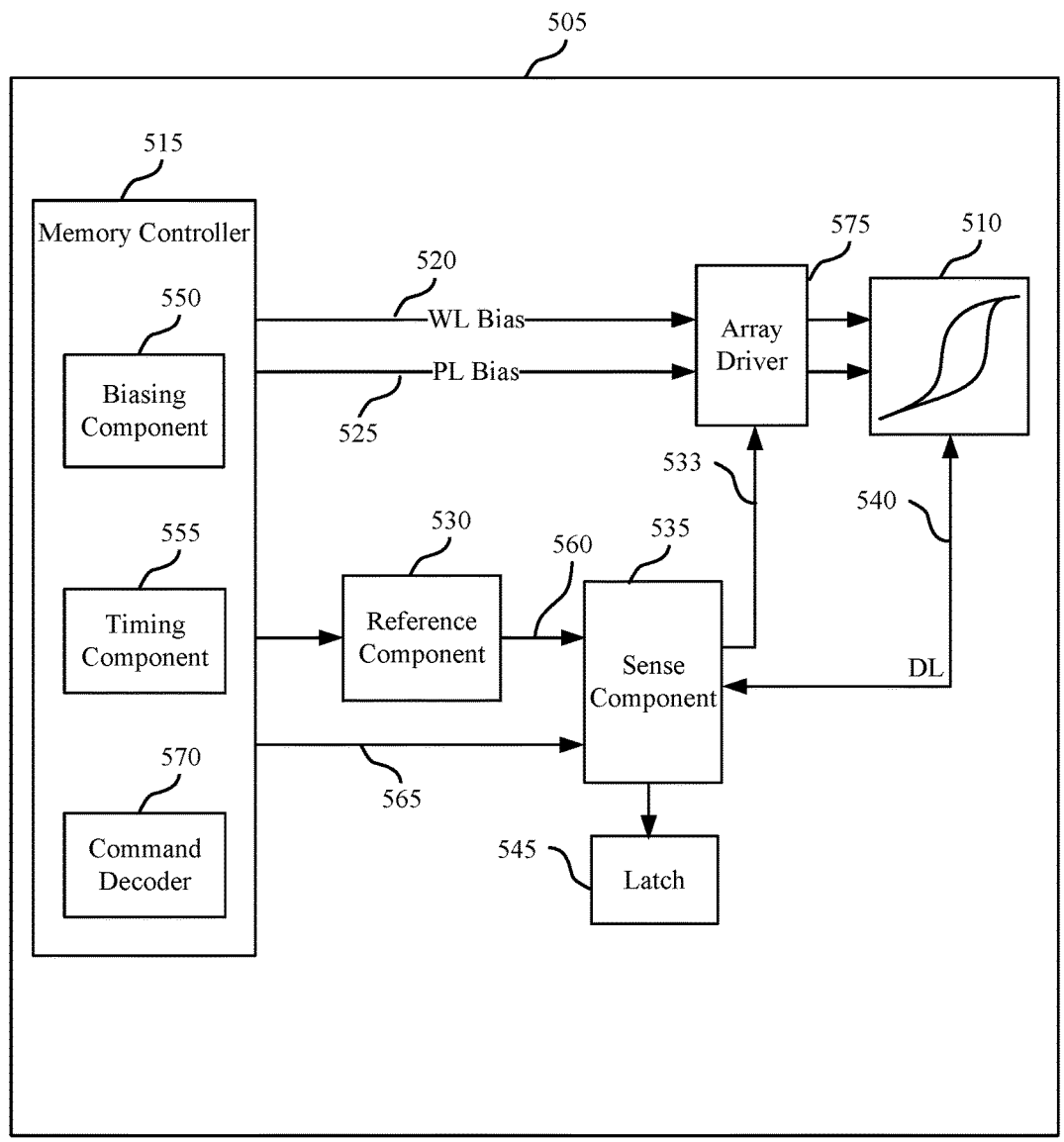
FIG. 5 illustrates a block diagram of an example ferroelectric memory array that supports storing operational information in non-volatile subarrays in accordance with various embodiments of the present disclosure.

FIG. 5 shows a block diagram 500 of a memory array 505 that supports storing operational information in non-volatile subarrays in accordance with various embodiments of the present disclosure. As mentioned above, operational information may include access instruction or other instructions applied to the memory array, a temperature of the memory array, a number of cycles performed by the memory array, or the like. Memory array 505 may be referred to as an electronic memory apparatus, and may be an example of a component of an memory array 100 as described with reference to FIG. 1. Memory array 505 may include one or more memory cells 510, a memory controller 515, a word line 520, a plate line 525, a reference component 530, a sense component 535, a digit line 540, a latch 545, a reference line 560, a sense control line 565, and an array driver 575. These components may be in electronic communication with each other and may perform one or more of the functions described herein. For example, array driver 575 may be in electronic communication with the output 533 of sense component 535. In some cases, memory controller 515 may include biasing component 550, timing component 555, and command decoder 570. Command decoder 570 and array driver 575 may be examples of the command decoder and array driver as discussed with reference to FIG. 4.

Memory controller 515 may be in electronic communication with word line 520, digit line 540, sense component 535, and plate line 525, which may be examples of word line 110, digit line 115, sense component 125, and plate line 210 described with reference to FIGS. 1, and 2. Memory array 505 may also include reference component 530 and latch 545. The components of memory array 505 may be in electronic communication with each other and may perform embodiments of the functions described with reference to FIGS. 1 through 4. In some cases, reference component 530, sense component 535, and latch 545 may be components of memory controller 515.

In some cases, memory array 505 may include a plurality of non-volatile memory cells 510. A non-volatile memory cell 510 may be writable with a logic state (e.g., a first or second logic state). In some examples, digit line 540 is in electronic communication with sense component 535 and a ferroelectric capacitor of non-volatile memory cells 510. Word line 520 may be in electronic communication with memory controller 515 and a selection component of non-volatile memory cell 510. Plate line 525 may be in electronic communication with memory controller 515 and a plate of the ferroelectric capacitor of non-volatile memory cell 510. Sense component 535 may be in electronic communication with memory controller 515, digit line 540, latch 545, and reference line 560. Reference component 530 may be in electronic communication with memory controller 515 and reference line 560. Sense control line 565 may be in electronic communication with sense component 535 and memory controller 515. These components may also be in electronic communication with other components, both inside and outside of memory array 505, in addition to components not listed above, via other components, connections, or busses.

Memory controller 515 may be configured to activate word line 520, plate line 525, or digit line 540 by applying voltages to those various nodes. For example, biasing component 550 may be configured to apply a voltage to operate memory cell 510 to read or write memory cell 510 as described above. In some cases, memory controller 515 may include a row decoder, column decoder, or both, as described with reference to FIG. 1. This may enable memory controller 515 to access one or more memory cells 105. Biasing component 550 may also provide voltage potentials to reference component 530 in order to generate a reference signal for sense component 535. Additionally, biasing component 550 may provide voltage potentials for the operation of sense component 535.

In some cases, memory controller 515 may perform its operations using timing component 555. For example, timing component 555 may control the timing of the various word line selections or plate biasing, including timing for switching and voltage application to perform the memory functions, such as reading and writing, discussed herein. In some cases, timing component 555 may control the operations of biasing component 550.

Reference component 530 may include various components to generate a reference signal for sense component 535. Reference component 530 may include circuitry configured to produce a reference signal. In some cases, reference component 530 may be implemented using other ferroelectric memory cells 105. Sense component 535 may compare a signal from memory cell 510 (through digit line 540) with a reference signal from reference component 530. Upon determining the logic state, the sense component may then store the output in latch 545, where it may be used in accordance with the operations of an electronic device that memory array 505 is a part. Sense component 535 may include a sense amplifier in electronic communication with the latch and the ferroelectric memory cell.

In some examples, memory controller 515, in combination with the array driver 575 and the other components of memory array 505, may be used to implement embodiments of receiving a plurality of signals corresponding to an access instruction for accessing a first set of non-volatile memory cells of a memory array; accessing the first set of non-volatile memory cells according to the received plurality of signals; and storing the access instruction at a second set of non-volatile memory cells included in the memory array.

In some examples, memory controller 515, in combination with the array driver 575 and the other components of memory array 505, may be used to implement embodiments of accessing a first set of non-volatile memory cells of a memory array according to a set of access instructions; storing the set of access instructions at a second set of non-volatile memory cells included in the memory array; determining that a failure has occurred while accessing the first set of non-volatile memory cells of the memory array in accordance with the set of access instructions; and reading from the second set of non-volatile memory cells the stored set of access instructions.

Figure 6:
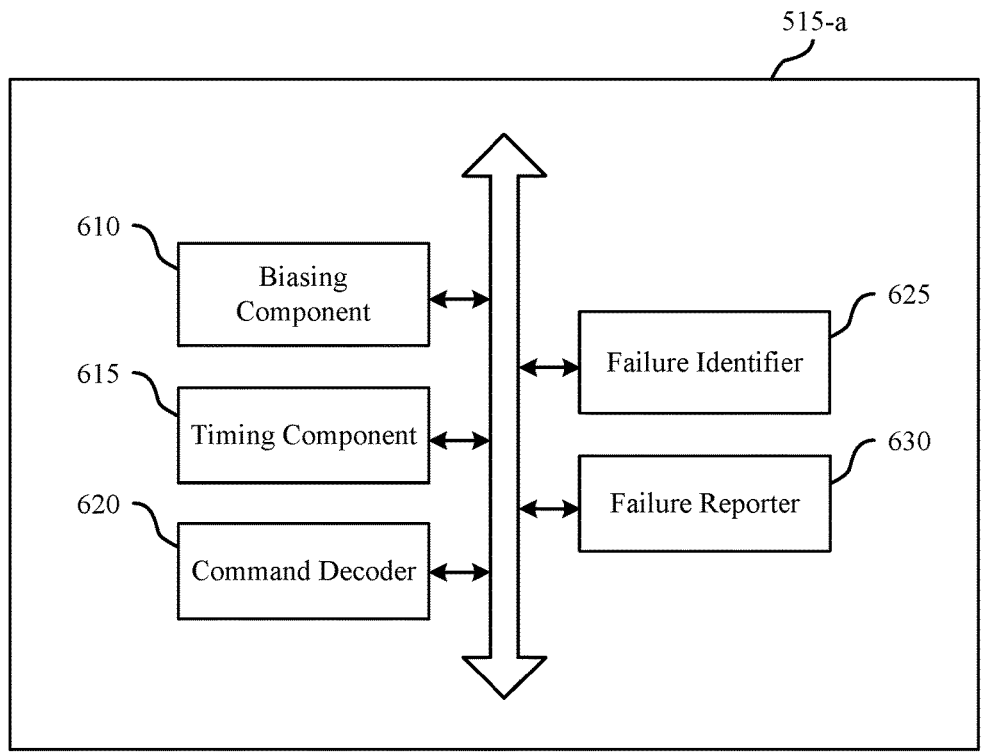
FIG. 6 illustrates a block diagram of a controller that supports storing operational information in non-volatile subarrays in accordance with embodiments of the present disclosure.

FIG. 6 shows a block diagram 600 of a memory controller 515-a that supports storing operational information in non-volatile subarrays in accordance with various embodiments of the present disclosure. As mentioned above, operational information may include access instruction or other instructions applied to the memory array, a temperature of the memory array, a number of cycles performed by the memory array, or the like. The memory controller 515-a may be an example of embodiments of a memory controller 715 described with reference to FIGS. 4, 5, and 7. The memory controller 515-a may include biasing component 610, timing component 615, and command decoder 620, failure identifier 625, and failure reporter 630. Each of these modules may communicate, directly or indirectly, with one another (e.g., via one or more buses). Biasing component 610, timing component 615, and command decoder 620 may be examples of biasing component 550, timing component 555, and command decoder 570 as described with reference to FIG. 5.

In some examples, biasing component 610 and timing component 615 may be used to send a plurality of signals corresponding to an access instruction or set of access instructions to an array driver. The plurality of signals may be generated by the command decoder 620, which as described with reference to FIG. 4, may be used to map binary strings that represent instructions to the corresponding plurality of signals that are used to implement the instruction at the memory array.

The failure identifier 625 may determine that an application has been unexpectedly terminated or identify that a number of error correcting code (ECC) errors has exceeded a threshold, or both. In some cases, the failure identifier 625 may receive a result of an access operation from the array driver and may compare the result with an expected result to determine whether an instruction pattern has been executed successfully. In some examples, the failure identifier 625 may be further programmed to determine a cause of the failure based at least in part on the based at least in part on the stored set of access instructions. For instance, the failure identifier 625 may be programmed to diagnose (e.g., using the present set of instructions being applied, physical characteristics of the array like temperature and age, voltage measurements, timing measurements, etc.) how and why a memory array has failed.

After the failure identifier 625 has identified a failure, the failure reporter 630 may activate a test mode at the array driver based at least in part on identifying the failure has occurred; and the array driver may begin storing the set of access instructions based at least in part on the test mode being activated. In some cases, the failure reporter may send an indication, such as a flag or activation signal, to trigger the array driver to begin storing information.

Figure 7:
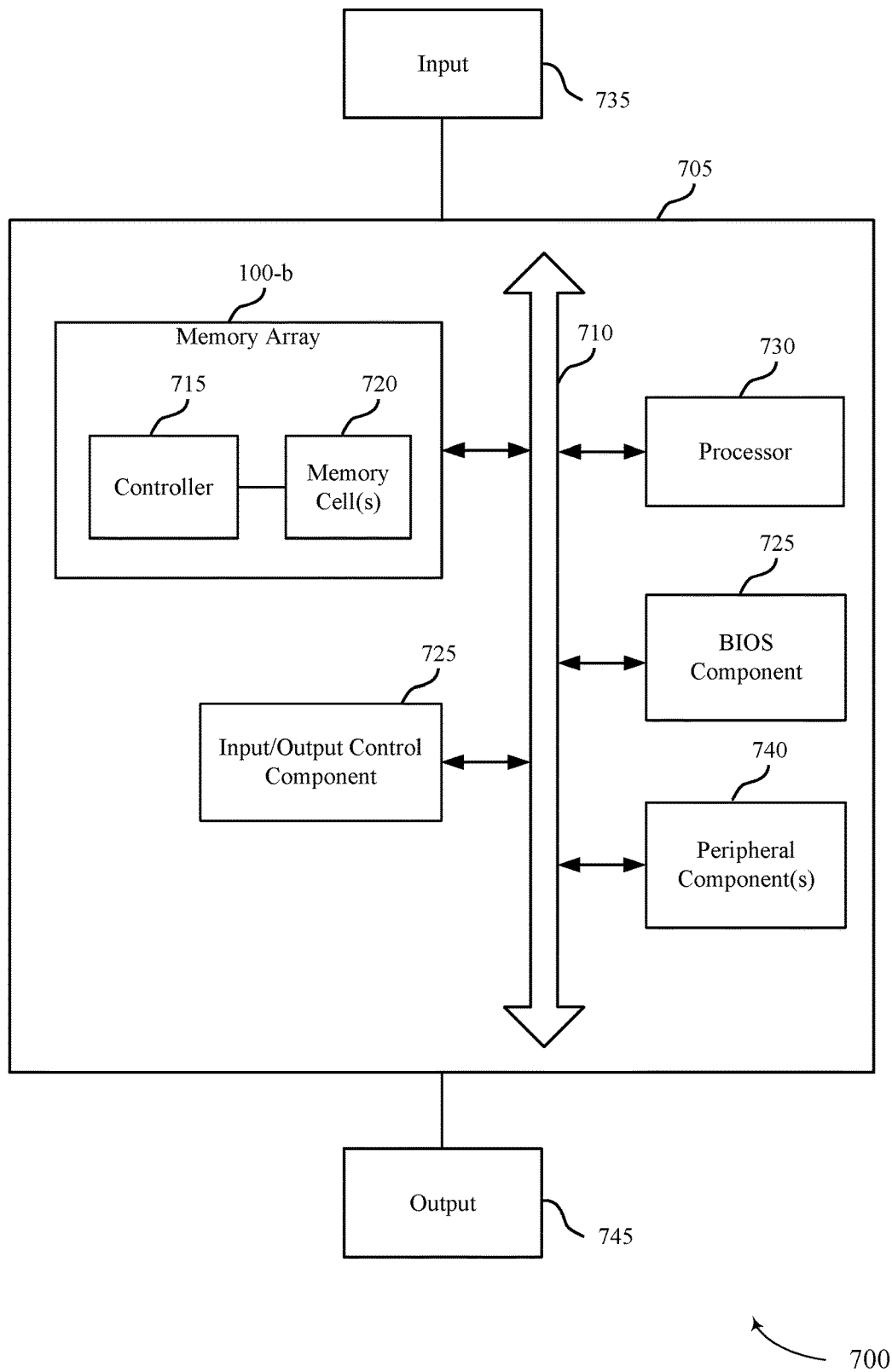
FIGS. 7 illustrates a system, including a memory array, that supports storing operational information in non-volatile subarrays in accordance with various embodiments of the present disclosure.

FIG. 7 shows a diagram of a system 700 including a device 705 that supports storing operational information in non-volatile subarrays in accordance with various embodiments of the present disclosure. As mentioned above, operational information may include access instruction or other instructions applied to the memory array, a temperature of the memory array, a number of cycles performed by the memory array, or the like. Device 705 may be an example of or include the components of a memory array as described above, e.g., with reference to FIGS. 1, 4, and 5.

Device 705 may include components for bi-directional voice and data communications including components for transmitting and receiving communications, including memory controller 715, memory cells 720, basic input/output system (BIOS) component 725, processor 730, I/O controller 725, and peripheral components 740. These components may be in electronic communication via one or more busses (e.g., bus 710).

Memory cells 720 may store information (i.e., in the form of a logical state) as described herein and may be an example of memory cells 105 and 510 as described herein (e.g., with reference to FIGS. 1, 2, and 5).

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a digital signal processor (DSP), a central processing unit (CPU), a microcontroller, an application-specific integrated circuit (ASIC), an field-programmable gate array (FPGA), a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting storing operational information in non-volatile sub arrays). 730.

I/O controller 725 may manage input and output signals for device 705. I/O controller 725 may also manage peripherals not integrated into device 705. In some cases, I/O controller 725 may represent a physical connection or port to an external peripheral. In some cases, I/O controller 725 may utilize an operating system such as iOS®, ANDROID®, MS-DOS®, MS-WINDOWS®, OS/2®, UNIX®, LINUX®, or another known operating system.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 735 may represent a device or signal external to device 705 that provides input to device 705 or its components. This may include a user interface or an interface with or between other devices. In some cases, input 735 may be managed by I/O controller 725, and may interact with device 705 via a peripheral component 740.

Output 745 may also represent a device or signal external to device 705 configured to receive output from device 705 or any of its components. Examples of output 745 may include a display, audio speakers, a printing device, another processor or printed circuit board, etc. In some cases, output 745 may be a peripheral element that interfaces with device 705 via peripheral component(s) 740. In some cases, output 745 may be managed by I/O controller 725

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or embodiments of such a device.

Figure 8:
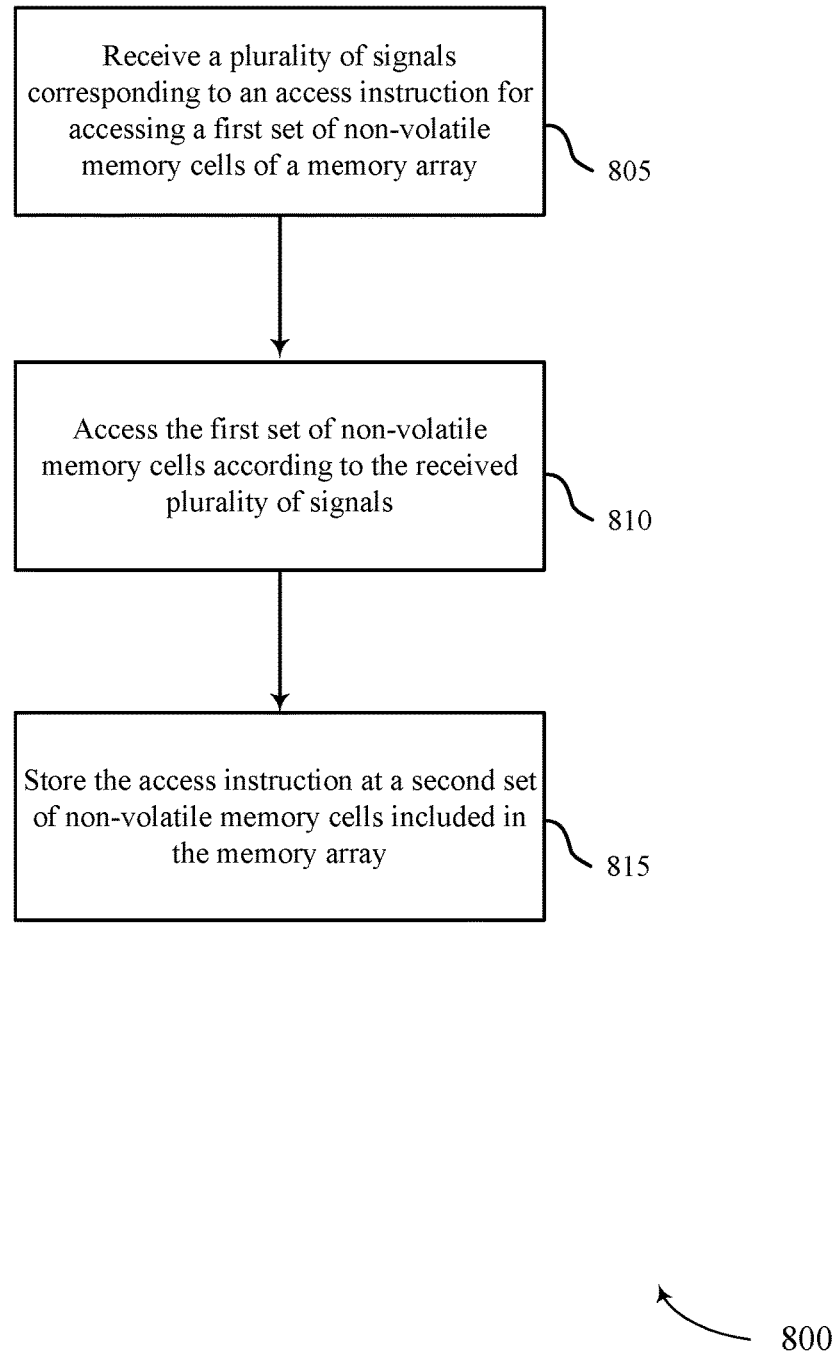
FIGS. 8-9 are flowcharts that illustrate a method or methods for the storing operational information in non-volatile subarrays in accordance with various embodiments of the present disclosure.

FIG. 8 shows a flowchart illustrating a method 800 for storing operational information in non-volatile subarrays in accordance with various embodiments of the present disclosure. As mentioned above, operational information may include access instruction or other instructions applied to the memory array, a temperature of the memory array, a number of cycles performed by the memory array, or the like. The operations of method 800 may be implemented by an array driver or its components as described herein. For example, the operations of method 800 may be performed by an array driver as described with reference to FIGS. 4 and 5. In some examples, an array driver may execute a set of codes to control the functional elements of the device to perform the functions described below. Additionally or alternatively, the array driver may perform embodiments the functions described below using special-purpose hardware.

At block 805 the array driver may receive a plurality of signals corresponding to an access instruction for accessing a first set of non-volatile memory cells of a memory array. In some examples, the array driver may also receive an address associated with the access instruction and corresponding to the first set of non-volatile memory cells. The access instruction may be a pre-programed instruction associated with accessing (e.g., reading, writing, or refreshing) a memory cell (e.g., an ACT, WR, RD, PRE, EQ instruction, etc.). The operations of block 805 may be performed according to the methods described with reference to FIGS. 1 through 4. In certain examples, embodiments of the operations of block 805 may be performed by a predecoder included in the array driver as described with reference to FIG. 4.

At block 810 the array driver may access the first set of non-volatile memory cells according to the received plurality of signals. In some cases, the first set of non-volatile memory cells are accessed using circuitry and access patterns that are specific to the first set of non-volatile memory cells. For instance, the access circuitry (e.g., access lines/plate lines/amplifiers) and access patterns (e.g., certain instructions, timing of instructions, biasing circuitry, timing of biasing, etc.) may be specialized physical components and procedures used to access a non-volatile memory cell. The operations of block 810 may be performed according to the methods described with reference to FIGS. 1 through 4. In certain examples, embodiments of the operations of block 810 may be performed by a set of amplifiers included in the array driver as described with reference to FIG. 4.

In some examples, the array driver may relay the plurality of signals or an amplified version of the plurality of signals to corresponding input pins of the memory array. The array driver may additionally determine a number of non-volatile memory cells to include in the second set of non-volatile memory cells based at least in part on an amount of information to be stored at the second set of non-volatile memory cells. In some cases, the determined number of non-volatile memory cells may be allocated to the subarray, for instance, by programming a memory controller to allocate a range of addresses to the subarray.

In some examples, the memory controller may receive an indication to begin storing access instructions at the second set of non-volatile memory cells before storing the access instruction. In some cases, the indication may be a binary value, or a change in a signal at an input pin (e.g., from low to high). The indication may comprise at least one of: a first flag received from an application that has experienced an operating failure, a second flag received from an error correction code component that has determined that a predetermined number of error correcting code (ECC) errors has occurred, or a trigger to enter a test mode, or any combination thereof. While activated, the array driver may determine a binary representation of the access instruction based at least in part on the received plurality of signals (e.g., an ACT command may correspond to the binary string {01106}). In some cases, the binary representation may be of a binary value of varying sizes (e.g. 1-bit, 2-bit, 4-bit, 8-bit, etc.).

At block 815 the array driver may store the access instruction at a second set of non-volatile memory cells included in the memory array. The operations of block 815 may be performed according to the methods described with reference to FIGS. 1 through 4. In certain examples, embodiments of the operations of block 815 may be performed using a combination of the set of amplifiers and a counter included in the array driver as described with reference to FIG. 4. In some examples, storing the access instruction comprises storing the binary representation of the access instruction at the second set of non-volatile memory cells. Storing the access instruction may also include writing the binary representation of the access instruction to a number of non-volatile memory cells of the second set of non-volatile memory cells.

Storing the access instructions may further comprise at least one of: storing an address of the first set of non-volatile memory cells, storing a value that indicates a temperature of the memory array, storing value that indicates a number of access operations performed on the memory array, storing a value that indicates a voltage of the memory array, storing data written to the first set of non-volatile memory cells, or storing a value that indicates a duration between access operations, or any combination thereof. In some examples, the same circuitry and access patterns used to access the first set of non-volatile memory cells may also be used to access the number of non-volatile memory cells of the second set of non-volatile memory cells. In some cases, the second set of non-volatile memory cells is implemented as a circular buffer. The array driver may increment a counter after storing the access instruction, a value of the counter indicating which non-volatile memory cells of the second set of non-volatile memory cells was last written.

In some examples, the second set of non-volatile memory cells may be storing a plurality of access instructions. The array driver may send a second plurality of signals to a command decoder, wherein the second plurality of signals corresponds to the plurality of access instruction for accessing the first set of non-volatile memory cells of the memory array. The second plurality of signals may correspond to the binary representations of the stored plurality of access instructions, and the stored plurality of access instructions may be provided to the command decoder in the order in which they were received at the array driver. In some cases, the command decoder may be a component of the memory array that is used to map the binary representation of an access instruction to a plurality of signals used to implement that instruction at the memory array (e.g., by asserting/de-asserting corresponding signals at control lines of the memory array).

The array driver may receive from the command decoder a third plurality of signals corresponding to the access instruction for accessing the first set of non-volatile memory cells of the memory array. And the array driver may access a third set of non-volatile memory cells according to the received third plurality of signals. The memory array may compare a result of accessing the third set of non-volatile memory cells with an expected result. And the memory array may determine a failure state of the third set of non-volatile memory cells based on the comparison. In some examples, the result may be an indication of whether an access operation has failed or succeeded. In some cases, the array driver may provide a result of accessing the third set of non-volatile memory cells to a memory controller for comparison and failure determination.

Figure 9:
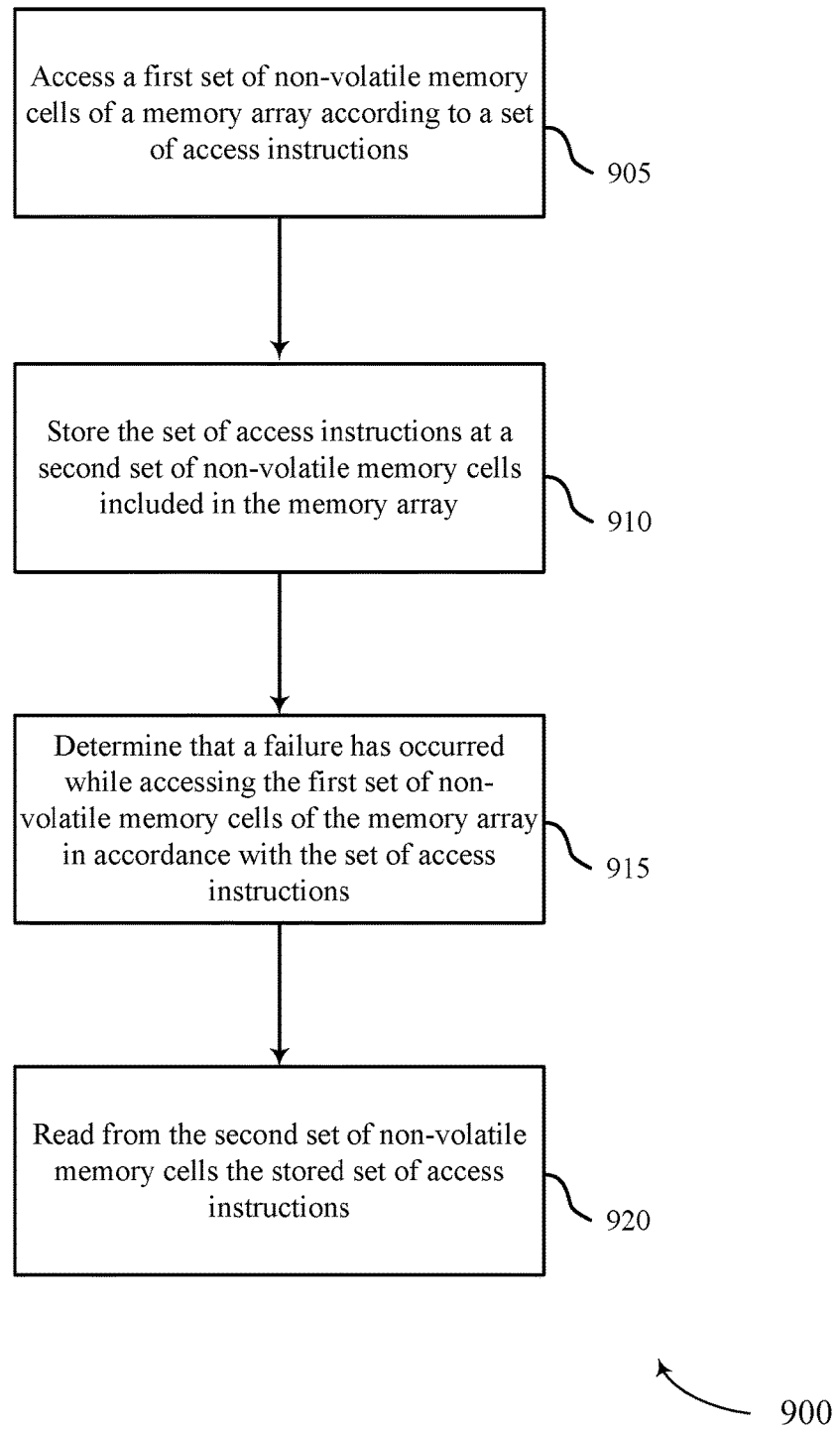

FIG. 9 shows a flowchart illustrating a method 900 for storing operational information in non-volatile subarrays in accordance with various embodiments of the present disclosure. As mentioned above, operational information may include access instruction or other instructions applied to the memory array, a temperature of the memory array, a number of cycles performed by the memory array, or the like. The operations of method 900 may be implemented by a memory controller or its components as described herein. For example, the operations of method 900 may be performed by a memory controller as described with reference to FIGS. 4 through 7. In some examples, a memory controller may execute a set of codes to control the functional elements of the device to perform the functions described below. Additionally or alternatively, the memory controller may perform embodiments the functions described below using special-purpose hardware.

At block 905, the array driver may access a first set of non-volatile memory cells of a memory array according to a set of access instructions. The operations of block 905 may be performed according to the methods described with reference to FIGS. 1 through 4. In certain examples, embodiments of the operations of block 905 may be performed by a set of amplifiers included in the array driver as described with reference to FIG. 4.

In some examples, the array driver may determine that an application has been unexpectedly terminated, that a number of error correcting code (ECC) errors has exceeded a threshold, or both. In some examples, the application may be any software/hardware-based application that accesses memory stored at the non-volatile memory array (e.g., a iOS application, a word processing application, etc.).

At block 910, the array driver may determine that a failure has occurred while accessing the first set of non-volatile memory cells of the memory array in accordance with the set of access instructions. Determining the failure has occurred may be based on determining that an application has been unexpectedly terminated, that a number of error correcting code (ECC) errors has exceeded a threshold, or both. The operations of block 910 may be performed according to the methods described with reference to FIGS. 1 through 4. In certain examples, embodiments of the operations of block 910 may be performed by a comparator included in the array driver or a failure identifier at a memory controller as described with reference to FIGS. 4 and 6. If the failure identifier is used, the failure reporter may send an indication that a failure has occurred to the array driver. In some examples, the array driver may activate a test mode based at least in part on determining that the failure has occurred. The test mode, if activated, may be a mode during which the array driver stores instructions applied to a memory array and other information associated with the memory array in the memory array itself At block 915, the array driver may store the set of access instructions at a second set of non-volatile memory cells included in the memory array. The operations of block 915 may be performed according to the methods described with reference to FIGS. 1 through 4. In certain examples, embodiments of the operations of block 915 may be performed using a combination of the set of amplifiers and a counter included in the array driver as described with reference to FIG. 4. In some cases, the storing the set of access instructions is based at least in part on the test mode being activated. In other cases, the storing operation at the array driver is always activated.

At block 920, the array driver may read from the second set of non-volatile memory cells the stored set of access instructions. The operations of block 920 may be performed according to the methods described with reference to FIGS. 1 through 4. In certain examples, embodiments of the operations of block 920 may be performed using a combination of the set of amplifiers included in the array driver and sense components as described with reference to FIG. 4. In some cases, the read set of instructions is indicative of what caused a failure of the memory array.

In some examples, the array driver provides the stored set of access instructions to a command decoder in a same order in which the stored set of access instructions were originally received. In some cases, the array driver also provides a set of addresses (e.g., the addresses of the first set of non-volatile memory cells) that each correspond to an access instruction to the command decoder. The array driver may then receive a plurality of signals corresponding to the provided stored set of access instructions and/or corresponding address from the command decoder and may access the first set of non-volatile memory cells according to the stored set of access instructions. The array driver may use this set of operations to determine a cause of the failure based at least in part on the stored set of access instructions.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving a first plurality of signals corresponding to an access instruction for accessing a first set of non-volatile memory cells of a memory array;
accessing, by applying the access instruction to the memory array, the first set of non-volatile memory cells according to the first plurality of signals; and
storing, at a second set of non-volatile memory cells included in the memory array, the access instruction applied to the memory array, the second set of non-volatile memory cells comprising a subarray of the first set of non-volatile memory cells of the memory array.

2. The method of claim 1, further comprising:
determining a binary representation of the access instruction based at least in part on the first plurality of signals, wherein storing the access instruction comprises:
storing the binary representation of the access instruction at the second set of non-volatile memory cells.

3. The method of claim 1, further comprising:
relaying the first plurality of signals or an amplified version of the first plurality of signals to corresponding input pins of the memory array.

4. The method of claim 2, wherein the first set of non-volatile memory cells are accessed using circuitry and access patterns associated with the first set of non-volatile memory cells, and wherein storing the access instruction comprises:
writing the binary representation of the access instruction to the second set of non-volatile memory cells using the circuitry and access patterns associated with the first set of non-volatile memory cells.

5. The method of claim 4, further comprising:
incrementing a counter after storing the access instruction, wherein a value of the counter indicates which non-volatile memory cells of the second set of non-volatile memory cells were last written.
6. The method of claim 1, further comprising:
sending a second plurality of signals to a command decoder, wherein the second plurality of signals corresponds to the access instruction for accessing the first set of non-volatile memory cells of the memory array;
receiving from the command decoder a third plurality of signals corresponding to the access instruction for accessing the first set of non-volatile memory cells of the memory array; and
accessing a third set of non-volatile memory cells according to the third plurality of signals.
7. The method of claim 6, further comprising:
comparing a result of accessing the third set of non-volatile memory cells with an expected result; and
determining a failure state of the third set of non-volatile memory cells.
8. The method of claim 6, wherein the second set of non-volatile memory cells is implemented as a circular buffer.
9. The method of claim 1, further comprising:
receiving an indication to begin storing the access instruction at the second set of non-volatile memory cells before storing the access instruction.
10. The method of claim 9, wherein the indication comprises at least one of:
a first flag received from an application that has experienced an operating failure, a second flag received from an error correction code component that has determined that a predetermined number of error correcting code (ECC) errors has occurred, or a trigger to enter a test mode, or any combination thereof.
11. The method of claim 1, further comprising at least one of:
storing an address of the first set of non-volatile memory cells, storing a value that indicates a temperature of the memory array, storing a value that indicates a number of access operations performed on the memory array, storing a value that indicates a voltage of the memory array, storing data written to the first set of non-volatile memory cells, or storing a value that indicates a duration between access operations, or any combination thereof.
12. The method of claim 1, further comprising:
determining a number of non-volatile memory cells in the second set of non-volatile memory cells based at least in part on an amount of information to be stored at the second set of non-volatile memory cells.
13. A method, comprising:
accessing a first set of non-volatile memory cells of a memory array according to a set of access instructions applied to the memory array;
storing the set of access instructions at a second set of non-volatile memory cells included in the memory array, the second set of non-volatile memory cells comprising a subarray of the first set of non-volatile memory cells of the memory array;
determining that a failure has occurred while accessing the first set of non-volatile memory cells of the memory array in accordance with the set of access instructions; and
reading from the second set of non-volatile memory cells the stored set of access instructions.
14. The method of claim 13, further comprising:
activating a test mode based at least in part on determining that the failure has occurred, wherein storing the set of access instructions is based at least in part on the test mode being activated.
15. The method of claim 13, wherein determining the failure has occurred comprises:
determining that an application has been unexpectedly terminated.
16. The method of claim 13, wherein determining the failure has occurred comprises:
determining that a number of error correcting code (ECC) errors has exceeded a threshold.
17. The method of claim 13, further comprising:
providing the stored set of access instructions to a command decoder in a same order in which the stored set of access instructions were originally received;
accessing the first set of non-volatile memory cells according to the stored set of access instructions; and
determining a cause of the failure based at least in part on the stored set of access instructions.
18. An apparatus, comprising:
a memory array that includes a plurality of non-volatile memory cells;
a subarray comprising a set of non-volatile memory cells of the plurality of non-volatile memory cells of the memory array to store access instructions applied to the memory array;
an array driver in electronic communication with a first set of access lines of the memory array;
a sense component in electronic communication with a second set of access lines of the memory array, wherein an output of the sense component is in electronic communication with the array driver; and
a command decoder in electronic communication with the array driver via a first set of command lines.
19. The apparatus of claim 18,
wherein the array driver comprises:
a counter to track which non-volatile memory cells of the subarray was last written;
a command predecoder to map a plurality of signals associated with an access instruction and received at the array driver to a binary representation of the access instruction; and
a set of amplifiers in electronic communication with the first set of access lines and the set of non-volatile memory cells, wherein the set of amplifiers are operable to amplify received signals to store the access instructions at the set of non-volatile memory cells.
20. The apparatus of claim 18, further comprising:
a set of address lines and a second set of command lines, wherein the command decoder is in electronic communication with the array driver via the set of address lines and the second set of command lines.
21. The apparatus of claim 18, further comprising:
a set of plate lines, wherein the array driver is in electronic communication with the memory array via the set of plate lines.
22. An apparatus, comprising:
a memory array comprising a plurality of non-volatile memory cells;
an array driver; and
a memory controller in electronic communication with the memory array and the array driver, wherein the memory controller is operable to cause the apparatus to:

access a first set of non-volatile memory cells of the memory array according to a set of access instructions applied to the memory array;

store the set of access instructions at a second set of non-volatile memory cells included in the memory array, the second set of non-volatile memory cells comprising a subarray of the first set of non-volatile memory cells of the memory array; and determine that a failure has occurred while accessing the memory array in accordance with the set of access instructions; and read, from the second set of non-volatile memory cells, the stored set of access instructions.

23. The apparatus of claim 22, wherein the memory controller is operable to cause the apparatus to:

activate a test mode based at least in part on identifying the failure has occurred; and store the set of access instructions is based at least in part on the test mode being activated.

24. The apparatus of claim 22, wherein the memory controller is operable to cause the apparatus to:

determine that an application has been unexpectedly terminated or identify that a number of error correcting code (ECC) errors has exceeded a threshold, or both.

25. The apparatus of claim 22, wherein the memory controller is operable to cause the apparatus to:

provide the stored set of access instructions to a command decoder in a same order in which the stored set of access instructions were received;

access the first set of non-volatile memory cells according to the stored set of access instructions; and determine a cause of the failure based at least in part on the stored set of access instructions.

* * * * *